United States Patent
Keum et al.

(10) Patent No.: US 7,112,810 B2
(45) Date of Patent: Sep. 26, 2006

(54) ION IMPLANTING APPARATUS AND ION IMPLANTING METHOD USING THE SAME

(75) Inventors: Gyeong-Su Keum, Suwon-si (KR);
Seung-Ki Chae, Seoul (KR);
Hyung-Sik Hong, Suwon-si (KR);
Sang-Yeob Cha, Seoul (KR);
Jae-Hyun Han, Gyeonggi-do (KR);
Tae-Sub Im, Suwon-si (KR);
Hyun-Kyu Kang, Seoul (KR);
Gil-Jung Yun, Yongin-si (KR);
Doo-Guen Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 41 days.

(21) Appl. No.: 10/964,735

(22) Filed: Oct. 15, 2004

(65) Prior Publication Data
US 2005/0133737 A1    Jun. 23, 2005

(30) Foreign Application Priority Data
Dec. 17, 2003    (KR) ...................... 10-2003-0092634

(51) Int. Cl.
*H01J 37/08*    (2006.01)
*H01J 37/244*    (2006.01)

(52) U.S. Cl. .................................. 250/492.23; 250/397
(58) Field of Classification Search ............ 250/492.21
See application file for complete search history.

(56) References Cited

U.S. PATENT DOCUMENTS

| 4,904,902 | A | * | 2/1990 | Tamai et al. ............ 315/111.81 |
| 5,329,129 | A | * | 7/1994 | Shono et al. ............ 250/492.2 |
| 6,462,552 | B1 | * | 10/2002 | Suzuki ...................... 324/458 |
| 6,601,163 | B1 | | 7/2003 | Cromer et al. ................. 713/1 |

FOREIGN PATENT DOCUMENTS

| JP | 03-095846 | * | 4/1991 |
| JP | 2002-0534772 | | 10/2002 |
| KR | 2001-0048314 | | 6/2001 |

* cited by examiner

*Primary Examiner*—Kiet T. Nguyen
*Assistant Examiner*—James J. Leyabourne
(74) *Attorney, Agent, or Firm*—Lee & Morse, P.C.

(57) ABSTRACT

In an ion implanting apparatus and an ion implanting method using the same, the ion implanting apparatus includes a disk chamber containing a rotatable disk, a wafer mounted on the rotatable disk, and a charge sensor for monitoring a charged state of the wafer, the charge sensor being fixed to the disk chamber to be adjacent to and facing a surface of the wafer. An output of the charge sensor may be used as feedback to control the charged state of the wafer.

23 Claims, 7 Drawing Sheets

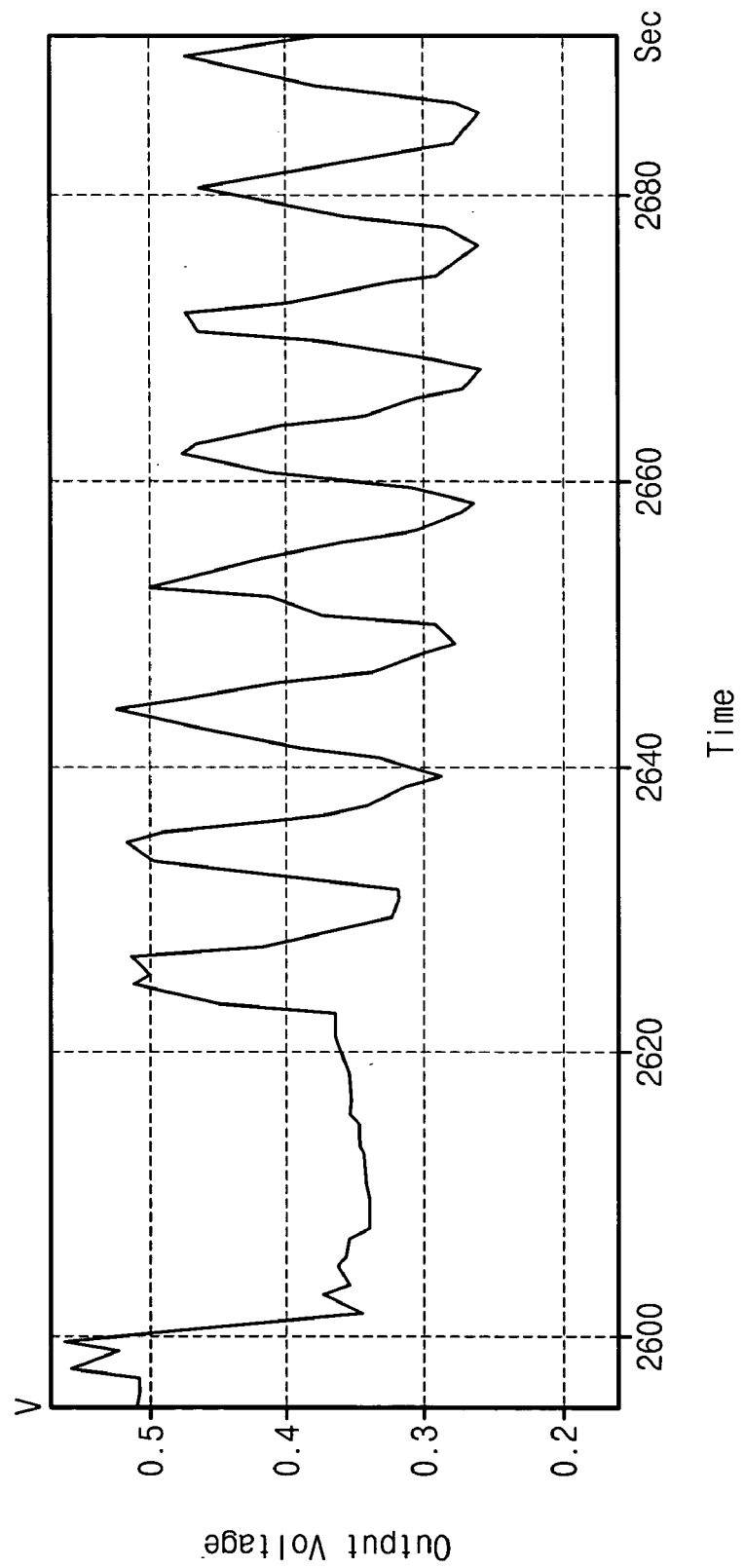

ION IMPLANTING APPARATUS AND ION IMPLANTING METHOD USING THE SAME

BACKGROUND OF THE INVENTION

1. Field of the Invention

The present invention relates to an ion implanting apparatus and an ion implanting method using the same. More specifically, the present invention is directed to an ion implanting apparatus that is capable of real-time charge monitoring system, the apparatus having an improved signal/noise ratio, and an ion implanting method using the same.

2. Description of the Related Art

In an ion implantation process, specific ions are doped to form a conductive region having a desired conduction type. In the semiconductor industry, ion implantation has been widely used to precisely form a thin region having a desired impurity concentration on a wafer. Since ions are charged particles, a workpiece implanted with the ions has the same charge as the ions. Because implanted ions have an energy on the order of several KeV to hundreds of KeV, secondary electrons may be discharged from the ion-implanted workpiece. Thus, ion implantation causes charges to accumulate on an insulator or a conductor.

A semiconductor wafer used to manufacture a semiconductor device includes an insulator, such as a gate oxide, and a conductor, such as a gate electrode. In a metal-insulator-semiconductor (MIS) structure, a capacitance (C) is made and a voltage (V) corresponding to charge quantity (Q)/capacitance (C) is generated, i.e., $V=Q/C$. For example, if cations are implanted into a wafer, numerous cations are accumulated on a conductor (e.g., the gate electrode) formed over an insulator (e.g., the gate oxide) to generate a voltage crossing an MIS capacitor formed of the conductor (gate electrode), the insulator (gate oxide), and the semiconductor (wafer). This voltage may lead to breakdown of the insulator. A breakdown of the insulator invites breakage of an LSI pattern of DRAM or flash memory series and results in a decrease in LSI manufacturing yield.

To protect a wafer from damage caused by charge accumulation (charge-up), a quantity of charges is reduced or charges of opposite polarity are used to neutralize the charges. Generally, ion implantation uses cations created by separating electrons from atoms. If electrons are coupled to cations, positive charges of the cations are neutralized. Conventionally, an electron shower has been used as an electron source for providing electrons to a wafer being ion-implanted to neutralize position ions.

FIG. 1 illustrates a cross-sectional view of a conventional ion implanting apparatus. FIGS. 2 and 3 are graphs for explaining disadvantageous aspects of the conventional ion implanting apparatus shown in FIG. 1.

In an ion implantation using an electron shower, it is desirable to continuously monitor the charge-up of the wafers being ion-implanted and to control the neutralization to minimize the charge on the wafers. Referring to FIG. 1, a first conductor 41 is positioned on a front surface of a disk 31, a second conductor 43 is positioned on a rear surface of the disk 31, and a third conductor 47 is fixed to a chamber 15. Charges accumulated on the first conductor 41 migrate through the second and third conductors 43 and 47 to detect a charged state of the wafer 35.

A procedure of transmitting a charge voltage applied to the second conductor 43 to the third conductor 47 is induction of capacitive coupling. Capacitance is inversely proportional to a distance between a measured face and a probe, and an output signal of a sensor is dependent on the capacitance. Therefore, as a distance between the second and third conductors 43 and 47 increases, an output signal from the third conductor 47 being a sensor decreases, as shown in FIG. 2. As a result, an error based on distance is generated.

The first conductor 41 must detect only cations. The first conductor 41, however, is constructed to face an emitted ion beam, so that it detects not only cations but also anions, neutrons, and secondary electrons. Therefore, an unwanted peak, i.e., noise, is included in the output signal of the third conductor 47 by disturbance, as shown in FIG. 3. For this reason, a signal/noise (S/N) ratio is reduced.

As described above, the conventional ion implanting apparatus exhibits several disadvantageous features, such as the error based on a distance and the noise caused by disturbance, which impair reliability of detecting a charged state of a wafer surface. Therefore, an ion implanting process using the above-described conventional ion implanting apparatus cannot avoid impairment of detection reliability.

SUMMARY OF THE INVENTION

The present invention is therefore directed to an ion implanting apparatus and method using the same, which substantially overcome one or more of the problems due to the limitations and disadvantages of the related art.

A feature of an embodiment of the present invention is to provide an ion implanting apparatus that is capable of reliable real-time charge monitoring and an ion implanting method using the same.

Another feature of an embodiment of the present invention is to provide an ion implanting apparatus and an ion implanting method using the same having an improved signal/noise ratio, thereby enhancing a reliability of an ion implantation process.

Still another feature of an embodiment of the present invention is to provide an ion implanting apparatus and an ion implanting method using the same including a charge sensor that is capable of reducing noise and improving detection of a charged voltage.

At least one of the above features and advantages of the present invention may be provided by an ion implanting apparatus including an ion implanting apparatus includes a disk chamber containing a rotatable disk, a wafer mounted on the rotatable disk, and a charge sensor for monitoring a charged state of the wafer, the charge sensor being fixed to the disk chamber to be adjacent to and facing a surface of the wafer.

The apparatus may further include a charge monitor for displaying the charged state of the surface of the wafer, the charge monitor being connected to the charge sensor.

The apparatus may further include an ion beam generating system for emitting cations toward the surface of the wafer, which is mounted on the rotatable disk, and an electron source for supplying electrons to the cations.

The apparatus may further include a control system connected to the electron source, the control system being operable to control operation of the electron source depending on the charged state of the surface of the wafer, which is mounted on the rotatable disk.

At least one of the above features and advantages of the present invention may be provided by an ion implanting apparatus including a rotatable disk on which a wafer is mounted, an ion beam generating system for emitting cations to a surface of the wafer, which is mounted on the rotatable disk, an electron source for supplying electrons to the cations emitted from the ion beam generating system to neutralize the cations, a control system for controlling the electron source to operate depending on a charged state of the surface of the wafer, a disk chamber containing the rotatable disk therein and defining a hermetic space sealed by a vacuum system, a charge sensor fixedly installed on the disk chamber adjacent to and facing the surface of a wafer, which is mounted on the rotatable disk, for sensing the charged state of the surface of the wafer, and a charge monitor connected to the charge sensor to display the charged state of the surface of the wafer mounted on the rotatable disk.

The control system may be connected to the charge monitor, the control system being operable to control the electron source depending on the charged state of the surface of the wafer received from the charge monitor.

In either embodiment, the charge sensor may be a vibration capacitance noncontact surface electrometer.

In either embodiment, the control system may control the electron source to oversupply electrons to neutralize the surface of the wafer, when the charged state of the surface of the wafer is positive, and the control system may control the electron source to undersupply electrons to neutralize the surface of the wafer, when the charged state of the surface of the wafer is negative.

In either embodiment, the electron source may include an electron gun for emitting primary electrons and a target for receiving the primary electrons to emit secondary electrons.

Either embodiment may further include a susceptor for receiving the wafer to be mounted thereon, the susceptor being disposed on the rotatable disk.

At least one of the above features and advantages of the present invention may be provided by an ion implanting method including generating cations, supplying electrons to the cations to neutralize the cations, implanting the neutralized cations into a wafer mounted on a rotatable disk, sensing a charged state of a surface of the wafer, and controlling the charged state of the surface of the wafer to be a neutral state.

In the method, supplying electrons to the cations to neutralize the cations may include emitting primary electrons from an electron gun of an electron source and receiving the primary electrons at a target of the electron source and emitting secondary electrons from the target.

In the method, sensing a charged state of a surface of the wafer may include sensing the charged state of the surface of the wafer, which is mounted on the rotatable disk, using a charge sensor that is mounted adjacent to and facing the surface of the wafer, and displaying the charged state of the surface of the wafer on a charge monitor, which is connected td the charge sensor.

In the method, controlling the charged state of the surface of the wafer to be a neutral state may include emitting primary electrons from an electron gun of an electron source, receiving the primary electrons at a target of the electron source and emitting secondary electrons from the target, and selectively controlling operation of the electron source using a control system depending on the charged state of the surface of the wafer.

Selectively controlling operation of the electron source using a control system depending on the charged state of the surface of the wafer may include oversupplying secondary electrons to the ion beam to neutralize the surface of the wafer, when the charged state of the surface of the wafer is positive, and undersupplying secondary electrons to the ion beam to neutralize the surface of the wafer, when the charged state of the surface of the wafer is negative.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 6 and 7 are graphs for explaining advantageous features of the ion implanting apparatus shown in FIG. 4.

DETAILED DESCRIPTION OF THE INVENTION

Korean Patent Application No. 2003-92634, filed on Dec. 17, 2003 in the Korean Intellectual Property Office, and entitled: "Ion Implanting Apparatus and Ion Implanting Method Using the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
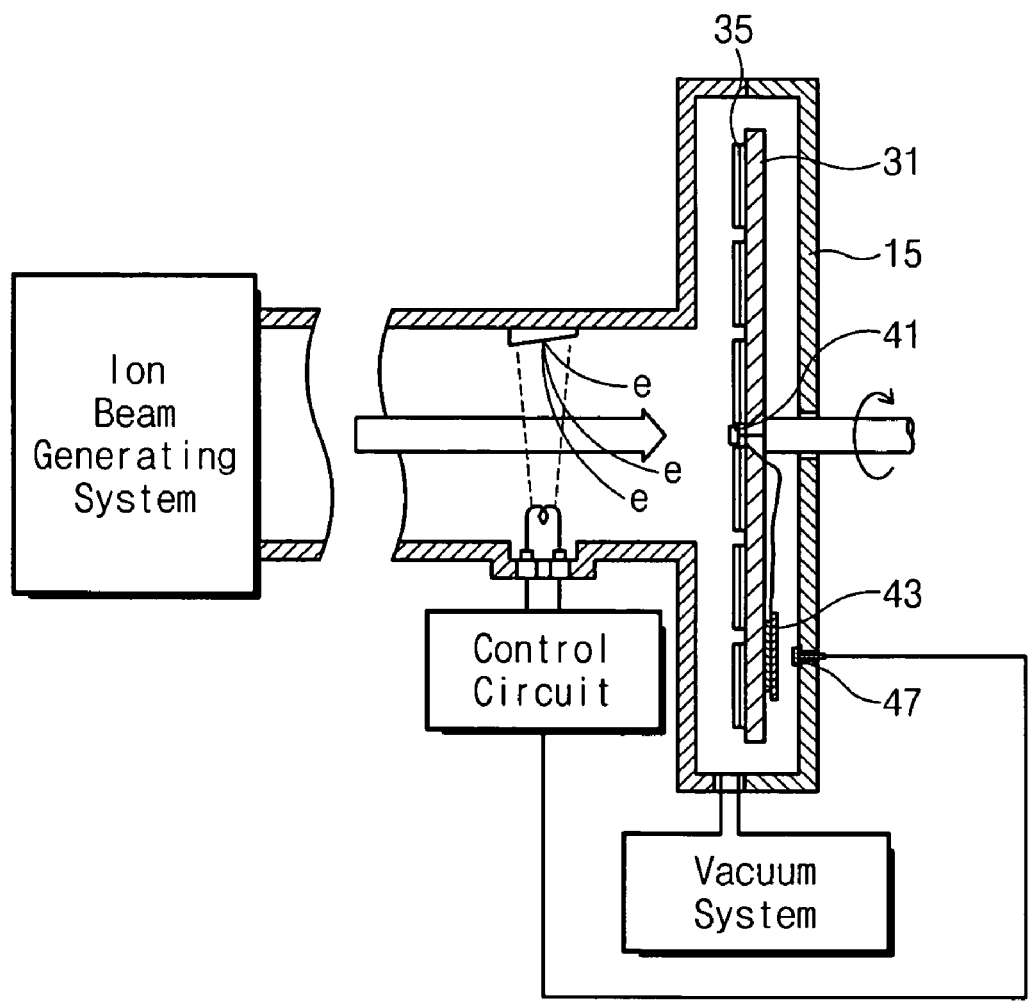
FIG. 1 illustrates a cross-sectional view of a conventional ion implanting apparatus.
Figure 2:
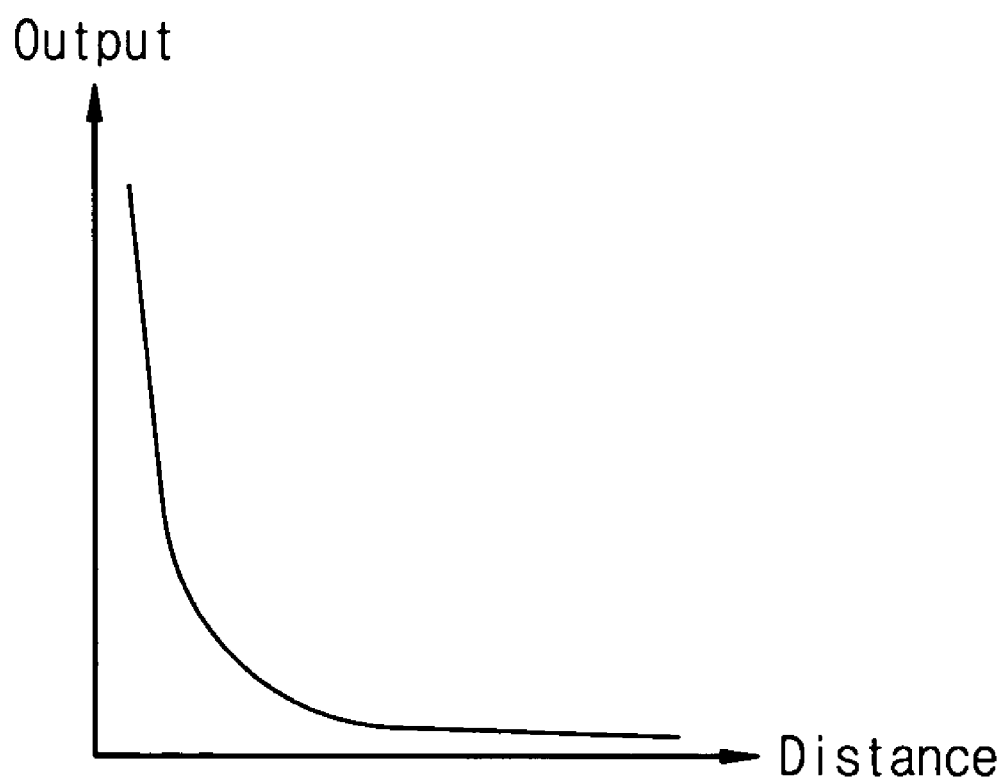
FIGS. 2 and 3 are graphs for explaining disadvantageous aspects of the conventional ion implanting apparatus shown in FIG. 1.
Figure 3:
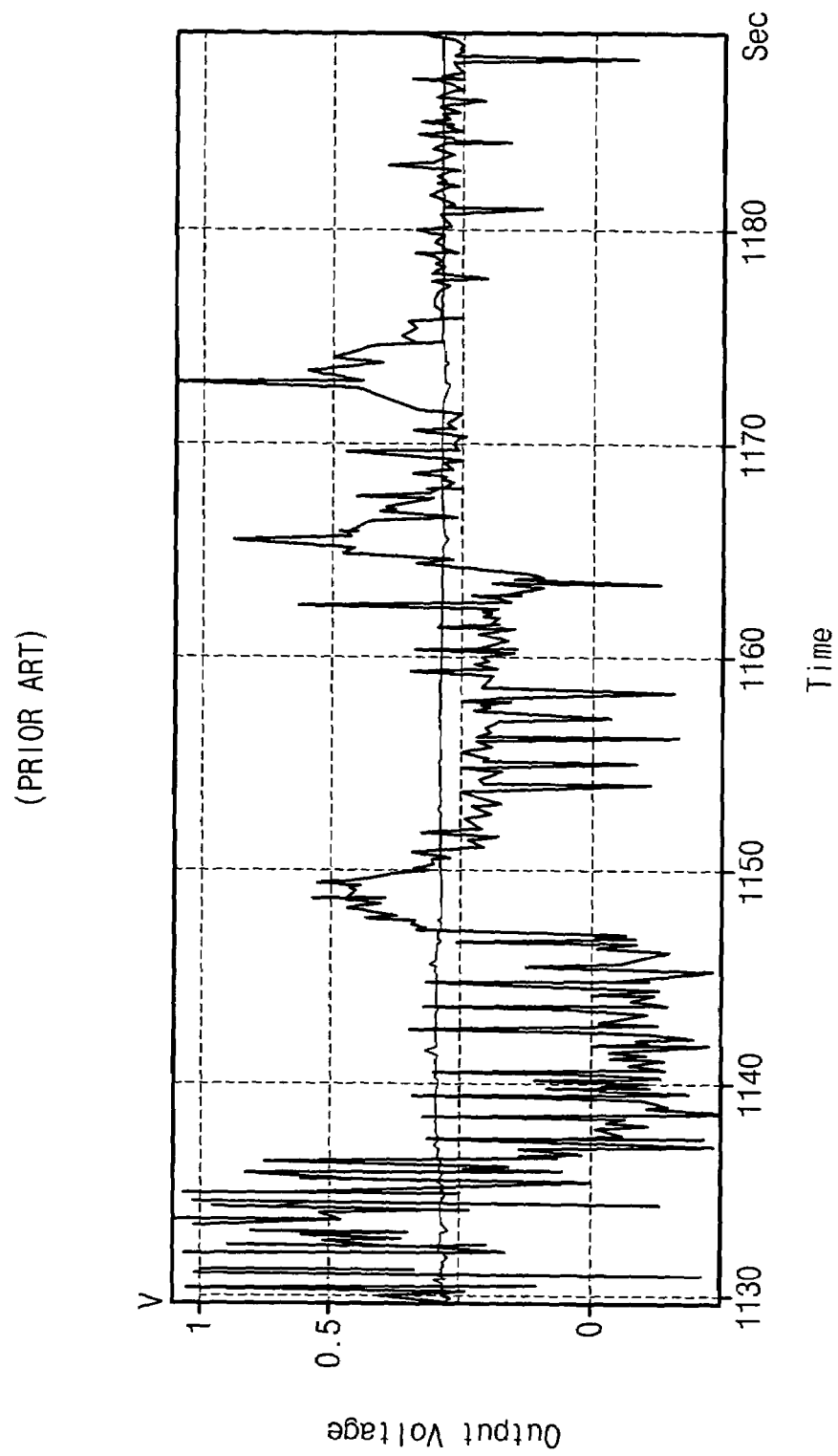
Figure 4:
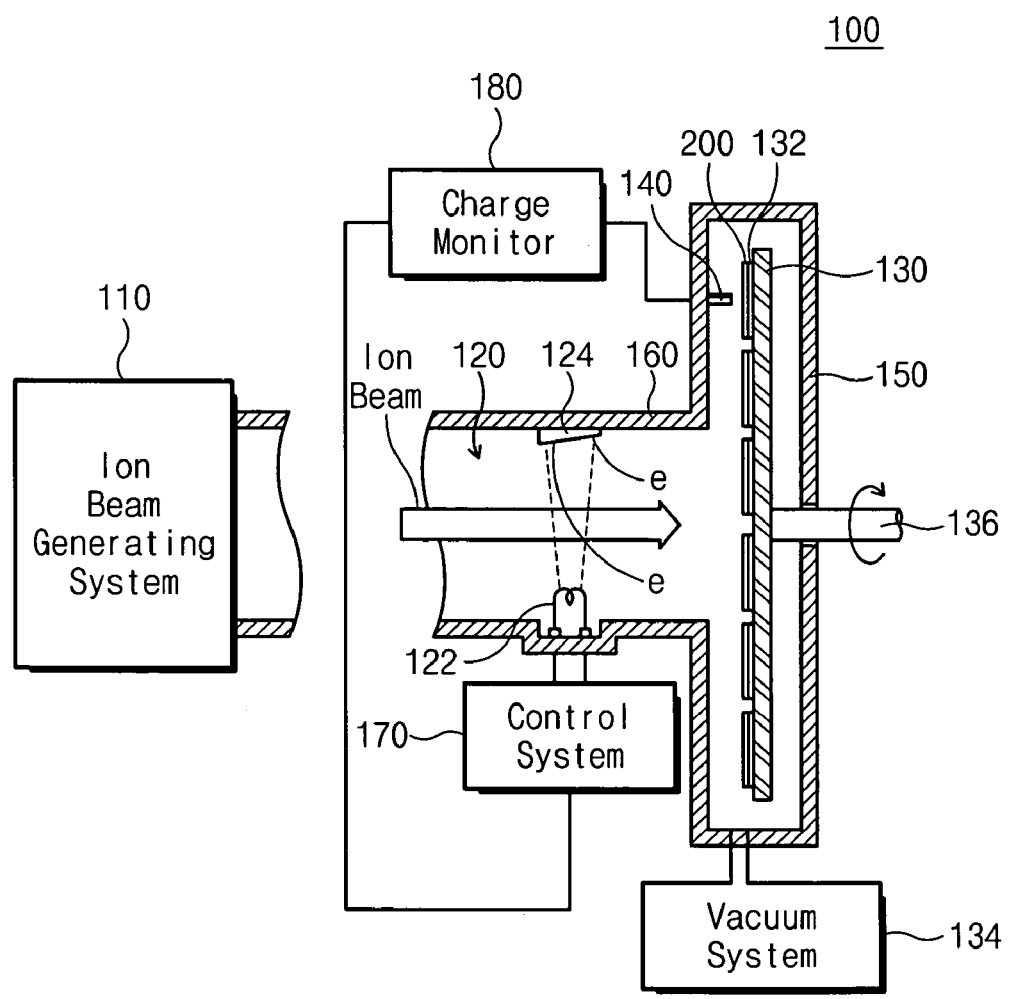
FIG. 4 illustrates a cross-sectional view of an ion implanting apparatus according to an embodiment of the present invention.
Figure 5:
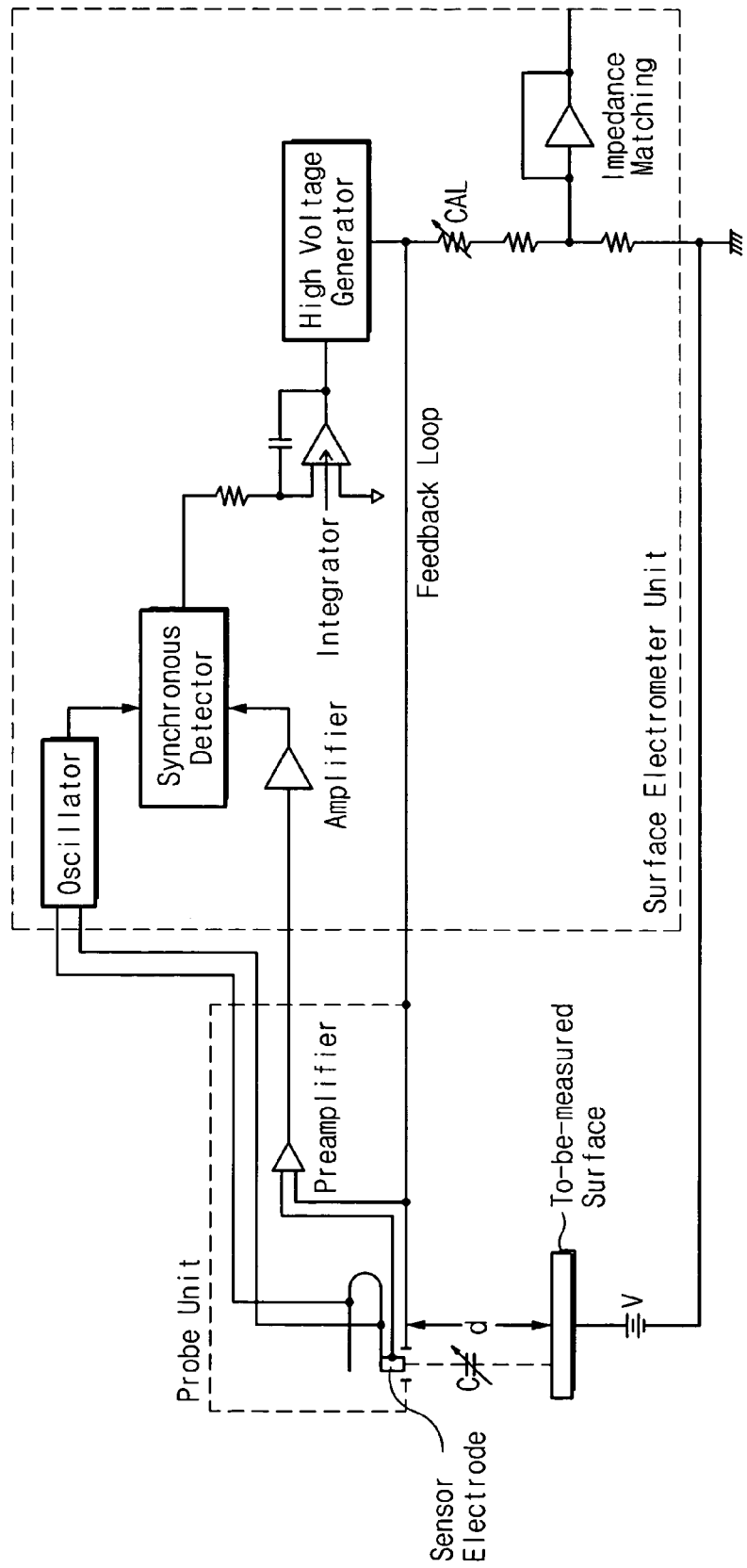
FIG. 5 is a circuit diagram of a charge sensor used in the ion implanting apparatus shown in FIG. 4.
Figure 6:
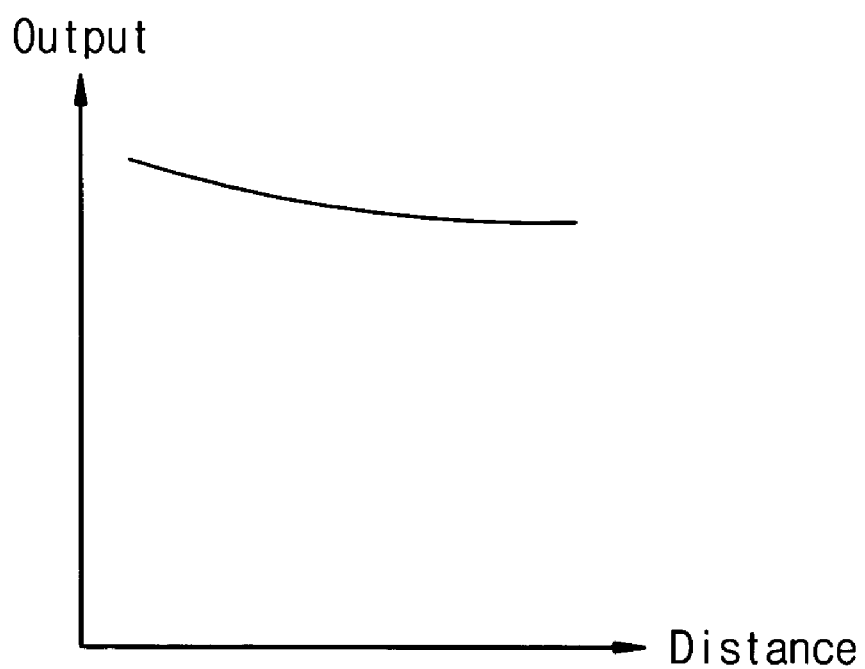

FIG. 4 illustrates a cross-sectional view of an ion implanting apparatus according to an embodiment of the present invention. FIG. 5 is a circuit diagram of a charge sensor used in the ion implanting apparatus shown in FIG. 4. FIGS. 6 and 7 are graphs for explaining advantageous features of the ion implanting apparatus shown in FIG. 4.

An ion implanting apparatus 100 according to an embodiment of the present invention includes an ion beam generating system 110, an electron source 120 for supplying electrons to cations emitted from the ion beam generating system 110, a rotatable disk 130 on which a wafer 200 is mounted, a disk chamber 150 containing the rotatable disk 130 therein, and a charge sensor 140 fixedly installed on the disk chamber 150 to monitor a charged state of a surface of the wafer 200 mounted on the rotatable disk 130.

The ion beam generating system 110 supplies an ion beam to a wafer 200 mounted on the rotatable disk 130 through an ion beam housing 160, which may be made of aluminum (Al) or other similar material. By supplying the ion beam to the wafer 200, a specific portion of the wafer 200 is doped to form an impurity region, such as a source/drain region.

The electron source 120 is disposed in the ion beam housing 160 to supply electrons to cations emitted from the ion beam generating system 110. When the electrons are supplied to the cations, the cations are neutralized to be implanted into the wafer 200. Thus, the wafer 200 avoids damage caused by charge-up.

The electron source 120 includes an electron gun 122 for emitting primary electrons and a target 124 for receiving the primary electrons emitted from the electron gun 122 to emit secondary electrons. For example, the electron gun 122 may be a filament heated by a predetermined power source to emit primary electrons. The target 124, which may be made of aluminum or other similar material, receives the primary electrons, which are emitted from the filament type electron gun 122 to be accelerated, to emit secondary electrons. The emitted secondary electrons are supplied to cations in the ion beam to neutralize the cations. The electron source 120 is connected to a control system 170. The control system 170 controls operation of the electrons source 120 depending on the charged state of the surface of the ion-implanted wafer 200 mounted on the rotatable disk 130. Control of the electron source 120 by the control system will be described below in greater detail.

A wafer susceptor 132 is disposed on the rotatable disk 130 in front of the traveling ion beam. The wafer susceptor 132 allows a wafer 200, or a plurality of wafers, to be mounted on the rotatable disk 130. The wafer susceptor 132 may be made of aluminum or an insulator. The rotatable disk 130 is contained in the disk chamber 150. The disk chamber 150 defines a hermetic space by means of a vacuum system 134 and revolves at a high speed about an axis 136 of the rotatable disk 130. Since the rotatable disk 130 is able to rotate and move up and down, it is advantageously used in uniform doping of the wafer 200.

The charge sensor 140 is disposed adjacent to and facing a surface of the wafer 200, which is mounted on the rotatable disk 130. Therefore, the charge sensor 140 is not opposite to a traveling direction of the ion beam, and thus, is free from deposition caused by the ion beam. The charge sensor 140 is connected to a charge monitor 180 that displays the charged state of the surface of the wafer 200 to allow a user to check the charged state in real time. The charge monitor 180 is connected to the control system 170. Accordingly, the control system 170 may control the operation of the electron source 120 depending on the wafer surface charged state sensed by the charge sensor 140. Specifically, an amount of secondary electrons emitted from the electron source 120 is regulated to neutralize the wafer surface charged state.

As described above, the charge sensor 140 monitors the charged state of the surface of the wafer 200. Measuring the charged state of the surface of the wafer 200 requires measuring static electricity. Generally, a quantity of charge of static electricity is small. If an electrostatic potential is measured by a typical contact type voltmeter, static electricity is discharged through the voltmeter, which results in a measurement problem. Thus, it is desirable that the wafer surface charged state is measured by a noncontact type surface electrometer, e.g., a vibration-capacitance noncontact surface electrometer, a circuit diagram of which is shown in FIG. 5. The vibration-capacitance noncontact surface electrometer is able to measure a voltage without directly contacting a to-be-measured object. Since the vibration-capacitance noncontact surface electrometer does not exchange charges with the to-be-measured object, it does not take charges from the to-be-measured object. Advantageously, the vibration-capacitance noncontact surface electrometer may measure a migration object.

Referring to FIG. 5, in the vibration-capacitance noncontact surface electrometer, a sensor electrode is disposed at a probe unit. If the sensor electrode approaches a wafer surface that is a to-be-measured surface, a capacitance (C) is produced between the sensor electrode and the to-be-measured surface. The capacitance is varied by a tuning fork in the probe unit. The tuning fork works by means of an oscillator. If the capacitance is varied by the tuning fork, an AC modulating signal of a surface potential is induced to the sensor electrode. The AC signal is amplified by a preamplifier in the probe unit and an amplifier in a surface electrometer unit. The amplified signal is a synchronously detected signal that is dependent on a capacitance.

Since a capacitance is based on a distance, an output voltage is also varied according to a distance between the probe and the to-be-measured surface. The vibration capacitance noncontact surface electrometer inputs the synchronously detected signal to an integral high voltage generator to generate a high voltage and feedbacks the high voltage to a probe. Thus, a voltage of the probe body rises to be equal to a voltage of the to-be-measured surface. If the voltage of the probe body becomes equal to the voltage of the to-be-measured surface, the capacitance (C) disappears to prevent a measuring error caused by a distance (d) between the probe and the to-be-measured surface, as shown in FIG. 6.

Further, if the vibration capacitance noncontact surface electrometer is applied as the charge sensor 140, a peak (noise)-free signal, i.e., an output signal of improved signal/noise (S/N) ratio may be obtained, as shown in FIG. 7. FIG. 7 shows an output voltage varied with lapse of time while rotating a rotatable disk 130 at a high speed of 7200 rpm.

The above-described ion implanting apparatus 100 operates as follows.

Returning to FIG. 4, the wafer 200 is mounted on the susceptor 132 of the rotatable disk 130, and the disk chamber 150 is disposed in a hermetic vacuum state by the vacuum system 134. The ion beam containing cations is emitted from the ion beam generating system 110 to travel toward the wafer 200 mounted on the rotatable disk 130. Before the ion beam reaches the wafer 200, the electron source 120 supplies electrons to the cations in the ion beam. The supplied electrons are secondary electrons from the target 124. The secondary electrons are generated by irradiation of primary electrons that are emitted from the electron gun 122 to be accelerated toward the target 124.

Particles neutralized by supplying the electrons to the cations are implanted into the wafer 200 mounted on the rotatable disk 130, thereby forming a doping area of a desired conduction type at a desired region of the wafer 200.

While the ion implantation is continuously performed, the rotatable disk 130 rotates at a high speed and the wafer 200 mounted on the rotatable disk 130 closely faces the charge sensor 140 fixed to the disk chamber 150. At this time, the charge sensor 140 senses a charged state of a surface of the wafer 200.

If the charged state of the surface of the wafer 200 is determined to be positive, the control system 170 controls the electron source 120 to oversupply secondary electrons to the ion beam such that the surface of the wafer 200 is neutralized. Alternatively, if the charged state of the surface of the wafer 200 is determined to be negative, the control system 170 controls the electron source 120 to undersupply secondary electrons to the ion beam such that the surface of the wafer 200 is neutralized. Namely, if possible, the number of cations in the ion beam is made to be equal to the number of secondary electrons and thus neutralized particles are implanted to a wafer.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An ion implanting apparatus, comprising:
a disk chamber containing a rotatable disk;
a charge sensor for monitoring a charged state of a wafer mounted on the rotatable disk, the charge sensor being fixed to the disk chamber to be adjacent to and facing a surface of the wafer; and
a charge monitor for displaying the charged state of the surface of the wafer, the charge monitor being connected to the charge sensor.

2. The ion implanting apparatus as claimed in claim 1, wherein the charge sensor is a vibration-capacitance non-contact surface electrometer.

3. The ion implanting apparatus as claimed in claim 1, further comprising:
an ion beam generating system for emitting cations toward the surface of the wafer; and
an electron source for supplying electrons to the cations.

4. The ion implanting apparatus as claimed in claim 3, further comprising:
a control system connected to the electron source, the control system being operable to control operation of the electron source depending on the charged state of the surface of the wafer.

5. The ion implanting apparatus as claimed in claim 4, wherein:
the control system controls the electron source to over-supply electrons to neutralize the surface of the wafer, when the charged state of the surface of the wafer is positive; and
the control system controls the electron source to under-supply electrons to neutralize the surface of the wafer, when the charged state of the surface of the wafer is negative.

6. The ion implanting apparatus as claimed in claim 4, wherein the electron source comprises:
an electron gun for emitting primary electrons; and
a target for receiving the primary electrons to emit secondary electrons.

7. The ion implanting apparatus as claimed in claim 6, wherein the electron gun is a filament heated by operation of the control system to emit primary electrons.

8. The ion implanting apparatus as claimed in claim 6, wherein the target comprises aluminum.

9. The ion implanting apparatus as claimed in claim 1, further comprising a susceptor for receiving the wafer to be mounted thereon, the susceptor being disposed on the rotatable disk.

10. The ion implanting apparatus as claimed in claim 9, wherein the susceptor comprises aluminum or an insulator.

11. An ion implanting apparatus, comprising:
a rotatable disk;
an ion beam generating system for emitting cations to a surface of a wafer mounted on the rotatable disk;
an electron source for supplying electrons to the cations emitted from the ion beam generating system to neutralize the cations;
a control system for controlling the electron source to operate depending on a charged state of the surface of the wafer;
a disk chamber containing the rotatable disk therein and defining a hermetic space sealed by a vacuum system;
a charge sensor fixedly installed on the disk chamber adjacent to and facing the surface of the wafer for sensing the charged state of the surface of the wafer; and
a charge monitor connected to the charge sensor to display the charged state of the surface of the wafer.

12. The ion implanting apparatus as claimed in claim 11, wherein the charge sensor is a vibration capacitance non-contact surface electrometer.

13. The ion implanting apparatus as claimed in claim 11, wherein:
the control system controls the electron source to over-supply secondary electrons to the ion beam to neutralize the surface of the wafer, when the charged state of the surface of the wafer is positive; and
the control system controls the electron source to under-supply secondary to the ion beam to neutralize the surface of the wafer, when the charged state of the surface of the wafer is negative.

14. The ion implanting apparatus as claimed in claim 13, wherein the control system is connected to the charge monitor, the control system being operable to control the electron source depending on the charged state of the surface of the wafer received from the charge monitor.

15. The ion implanting apparatus as claimed in claim 11, wherein the electron source comprises:
an electron gun for emitting primary electrons; and
a target for receiving the primary electrons to emit secondary electrons.

16. The ion implanting apparatus as claimed in claim 15, wherein the electron gun is a filament heated by operation of the control system to emit primary electrons.

17. The ion implanting apparatus as claimed in claim 15, wherein the target comprises aluminum.

18. The ion implanting apparatus as claimed in claim 11, further comprising a susceptor for receiving the wafer to be mounted thereon, the susceptor being disposed on the rotatable disk.

19. The ion implanting apparatus as claimed in claim 18, wherein the susceptor comprises aluminum or an insulator.

20. An ion implanting method, comprising:
generating cations;
supplying electrons to the cations to neutralize the cations;
implanting the neutralized cations into a wafer mounted on a rotatable disk;
sensing a charged state of a surface of the wafer; and
controlling the charged state of the surface of the wafer to be a neutral state, wherein sensing the charged state of the surface of the wafer comprises:
sensing the charged state of the surface of the wafer, which is mounted on the rotatable disk, using a charge sensor that is mounted adjacent to and facing the surface of the wafer; and
displaying the charged state of the surface of the wafer on a charge monitor, which is connected to the charge sensor.

21. The ion implanting method as claimed in claim 20, wherein supplying electrons to the cations to neutralize the cations comprises:
emitting primary electrons from an electron gun of an electron source; and
receiving the primary electrons at a target of the electron source and emitting secondary electrons from the target.

22. The ion implanting method as claimed in claim 20, wherein controlling the charged state of the surface of the wafer to be a neutral state comprises:
   emitting primary electrons from an electron gun of an electron source;
   receiving the primary electrons at a target of the electron source and emitting secondary electrons from the target; and
   selectively controlling operation of the electron source using a control system depending on the charged state of the surface of the wafer.

23. The ion implanting method as claimed in claim 22, wherein selectively controlling operation of the electron source using a control system depending on the charged state of the surface of the wafer comprises:
   oversupplying secondary electrons to the ion beam to neutralize the surface of the wafer, when the charged state of the surface of the wafer is positive; and
   undersupplying secondary electrons to the ion beam to neutralize the surface of the wafer, when the charged state of the surface of the wafer is negative.

* * * * *